United States Patent [19]

Brunner et al.

[11] 3,953,795
[45] Apr. 27, 1976

[54] TRANSFORMERLESS KILOWATTHOUR METER FOR AN ELECTRICAL POWER LINE

[75] Inventors: Julius Brunner, Rückersdorf; Manfred Schwendtner, Schwarzenbruck; Günter Steinmuller, Nurnberg, all of Germany

[73] Assignee: Siemens Aktiengesellschaft, Munich, Germany

[22] Filed: Sept. 26, 1974

[21] Appl. No.: 509,681

[30] Foreign Application Priority Data
Sept. 27, 1973  Germany............................ 2348667

[52] U.S. Cl.............................. 324/142; 235/194; 328/158; 328/160
[51] Int. Cl.² ..................... G01R 7/00; G01R 11/32
[58] Field of Search ............ 324/142; 328/158, 160; 235/194

[56] References Cited
UNITED STATES PATENTS

| 3,500,200 | 3/1970 | Woodhead | 324/142 |
| 3,746,851 | 7/1973 | Gilbert | 324/142 |
| 3,760,273 | 9/1973 | Burkett et al. | 324/142 |
| 3,818,340 | 6/1974 | Yamaguchi | 324/142 |

Primary Examiner—Saxfield Chatmon, Jr.
Attorney, Agent, or Firm—Kenyon & Kenyon Reilly Carr & Chapin

[57] ABSTRACT

This invention is an electronic kilowatthour meter with a time-division multiplier, wherein a proportional first current is derived from the load voltage without a voltage transformer and a proportional second current is derived by means of an inverting amplifier, with a polarity opposite to that of the first current and instantaneous values halved as compared to the first current, and that the first current is added to the second current in one of two switching conditions by means of a switch which is operated by a pulse width-frequency modulator controlled by the load current, so that the average value of the sum current is proportional to the product of the load current and the load voltage.

12 Claims, 2 Drawing Figures

TRANSFORMERLESS KILOWATTHOUR METER FOR AN ELECTRICAL POWER LINE

BACKGROUND OF THE INVENTION

1. Field of the Invention

The invention concerns an electronic kilowatthour meter with a time-division multiplier.

2. Description of the Prior Art

The German Pat. No. 1,807,581 shows a circuit arrangement for measuring electric energy, in which a time-division multiplier is used, wherein a pulse width-frequency modulator is employed which controls, by means of a switch, the polarity of a signal which is formed by means of a current transformer and is proportional to the current, so that the mean value of this signal, averaged over time, is proportional to the product of voltage and current. By means of a succeeding current-frequency converter a pulse sequence with a pulse repetition frequency proportional to the product is formed for a subsequent pulse count.

It is an object of the invention to simplify an electronic kilowatthour meter of the kind described above without degrading the measuring accuracy.

SUMMARY OF THE INVENTION

The electronic kilowatthour meter according to the invention is characterized by the feature that a proportional first current is derived from the load voltage without a voltage or current transformer and a proportional second current is derived by means of an inverting amplifier, with a polarity opposite to that of the first current and instantaneous values halved as compared to the first current. The first current is added to the second current in one of the two switching conditions by means of a switch which is operated by a pulse-width-frequency modulator controlled by the load current, so that the mean value of the sum current is proportional to the product of the load current and the load voltage. In this manner, the voltage transformer ordinarily required to derive a quantity proportional to the load voltage, and a switch can be saved.

A further simplification of the circuit as well as a cost reduction can be effected, according to a further feature of the invention, by applying the sum current to a load with low input resistance, so that the load voltage remains below approximately 0.5 V, and by applying the first current to the summing point of the first and the second current by means of two anti-parallel diodes whose leads not connected to the summing point can be connected to the reference potential of the voltage by means of the switch. Thereby, errors stemming from the switches of the time-division multiplier can be eliminated, because the residual voltage of the single switch is not critical in the conducting state. As is well known, electronic switches have, in the conducting state, a non-negligible residual voltage, are temperature- and age-dependent and have therefore a detrimental effect on the measuring accuracy of the meter.

A further simplification and cost reduction for large production volumes can be accomplished by making the pulse-width-frequency modulator including the associated switch, a monolithic integrated semiconductor circuit.

DESCRIPTION OF THE INVENTION

Figure 1:
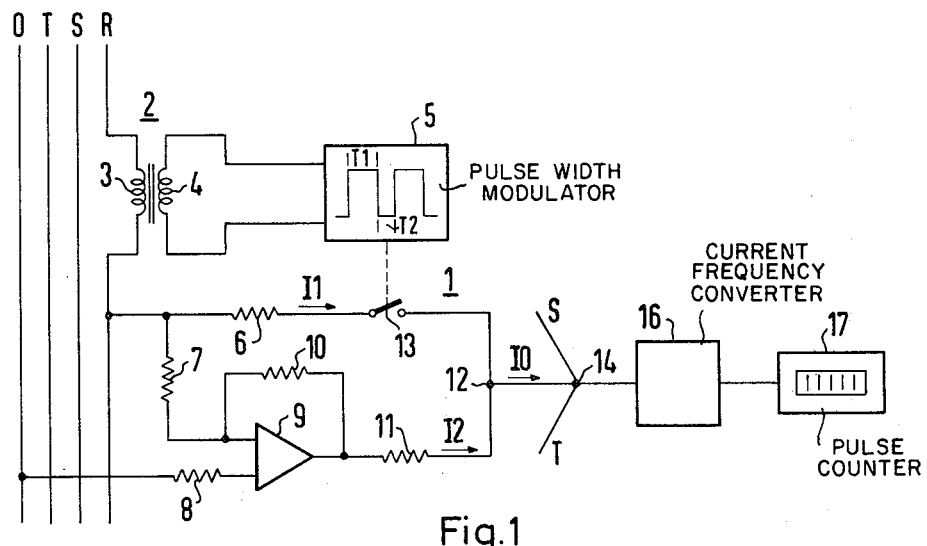
FIG. 1 shows a block diagram of a circuit arrangement for an electronic kilowatthour meter.
Figure 2:
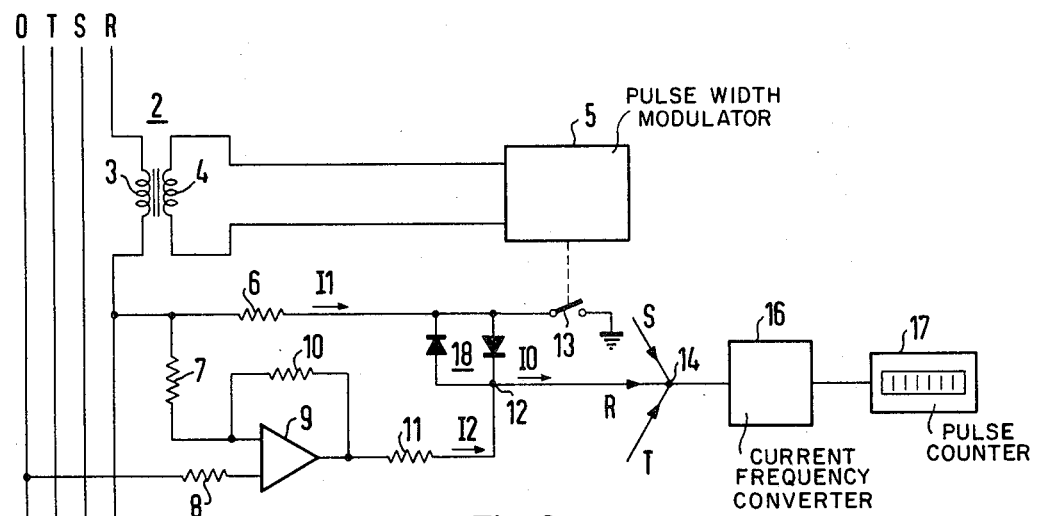
FIG. 2 shows another design variant of the circuit of FIG. 1.

The phases of a three-phase system are designated as RST. in FIGS. 1 and 2, but only the time-division multiplier 1 for phase R is shown in principle. A current transformer 2 is shown for phase R, having a primary winding 3 connected in series with phase lead R, while its secondary winding 4 applies a signal proportional to the current in lead R to a pulse width frequency modulator 5 of the time-division multiplier 1. Contrary to prior art electronic kilowatthour meters, the pulse width frequency modulator is not controlled by the load voltage, but by the load current.

A typical pulse width frequency modulator, is described, in German Patent 1,591,963, where a multivibrator is associated with two separate current sources, each of which consists of a transistor. The collector of each transistor is connected to the emitter of the associated transistor of the multivibrator. The emitter of each transistor emitter is connected by means of a resistor to a battery voltage. The bases of the two transistors of the current sources are connected with the two ends of the secondary winding of a voltage transformer, whose center tap is connected to a constant reference voltage.

A first current I1 is derived from the load voltage of the phase R via a resistor 6, without a voltage transformer. By means of a resistor 7 as well as an inverting amplifier 9 and the resistors 10 and 11, a second current I2, proportional to the load current and with a polarity opposite to that of the first current is derived, which, however, has only one half the instantaneous value of the current I1. The two currents I1 and I2 are summed at a point 12, the current I1 being applied by means a switch 13, which is operated by the modulator 5. The two currents I1 and I2 are added during the "on" period T1, while only the current I2 flows during the "off" period T2. As will be shown below, the average value of the sum current I0 is proportional to the product of the load current and the load voltage. At a point 14, to which the sum currents of the phases S and T can be connected, a quantizer 16 is connected in a manner known in the prior art, which is designed as a current-frequency converter and drives a pulse counter 17.

Assuming that the current $I1 \sim k \cdot V_R$ and the current $I2 \sim -\tfrac{1}{2} k \cdot V_R$, the average value of the current I0 is $$\bar{I0} = \frac{T_1(I1 + I2) + T2\, I2}{T1 + T2};$$

after substituting the values for I1 and I2, one obtains $$\bar{I0} = \tfrac{1}{2} k \cdot V_R (T1 - T2)/(T1 + T2)$$

and because the pulse width frequency modulator 5 is controlled by the load current, the current I0 has an average value, $$\bar{I0} \sim \tfrac{1}{2} k \cdot V_R \cdot I_R.$$

Because in the circuit of FIG. 1 the voltage transformer is eliminated and only one switch is required, a cost reduction and simplification of the electronic kilowatthour meter results.

FIG. 2 shows another example embodiment, where functionally similar parts are provided with the same reference numerals as in FIG. 1. The circuit arrangement is designed so that the load voltage appearing at point 14 always remains smaller than approximately 0.5 V. The first current I1, furthermore, is applied to the summing point 12 by means of two anti-parallel-connected diodes 18, where the leads not connected to the summing point 12 can be connected to the ground potential 0 by means of the switch 13. Not only is the potential of the switch 13 fixed unequivocally thereby, as compared to the circuit according to FIG. 1, but the residual voltage of the switch in the conducting state becomes insignificant.

The pulse width-frequency modulator 5 controlled by the load current including the associated switch 13, can be advantageously designed as a monolithic integrated semiconductor circuit. The switch 13 in accordance with FIGS. 1 and 2 can be, of course, a solid-state semiconductor switch.

What is claimed is:

1. An apparatus for measuring kilowatthours in an electrical power line, comprising:
    a pulse width-frequency modulator, coupled to said line and controlled by the load current thereof;
    transformerless first means, coupled to said line, for generating a first current which is proportional to the load voltage of said line;
    transformerless second means, including inverting amplifying means, coupled in parallel relationship to said transformerless first means, for generating a second current which is opposite in polarity to said first current and is proportional to one half the instantaneous value of said first current; and
    switching means, controlled by said modulator, and coupled in series relationship to said transformerless first means, for adding said first current to said second current in one of two switching conditions, the average value of the sum of said first and second currents being proportional to the product of the load current and the load voltage of said power line.

2. The apparatus recited in claim 1, wherein said power line comprises a multi-phase current system including a plurality of electrical power lines; wherein separate apparatus comprising said pulse width-frequency modulator, said transformerless first and second means, and said switching means are separately coupled to each of said power lines of said multi-phase current system; and wherein said apparatus for each of said power lines are electrically coupled at a common junction for adding the sums of said first and second currents of each of said power lines of said multi-phase current system.

3. The apparatus recited in claim 1, further comprising quantizer means, coupled to said transformerless first and second means, for converting the sum of said first and second currents provided by said switching means into an alternating signal, the frequency of which is proportional to the magnitude of the sum of said first and second currents; and a pulse counter, coupled to said quantizer means, for counting the pulses of said alternating signal.

4. The apparatus recited in claim 2, further comprising quantizer means, coupled to said common junction, for converting the added sums of said first and second currents of each of said power lines at said junction into an alternating signal, the frequency of which is proportional to the magnitude of the added sums of said currents; and a pulse counter, coupled to said quantizer means, for counting the pulses of said alternating signal.

5. The apparatus recited in claim 1, wherein said pulse width-frequency modulator and said switching means comprise a single monolithic integrated semiconductor circuit.

6. The apparatus recited in claim 2, wherein said pulse width-frequency modulator and said switching means of each of said apparatus for each of said lines of said multi-phase current system comprise a single monolithic integrated semiconductor circuit.

7. An apparatus for measuring kilowatthours in an electrical power line, comprising:
    a ground terminal at a reference voltage of zero volts;
    a pulse width-frequency modulator, coupled to said line and controlled by the load current thereof;
    transformerless first means, coupled to said line, for generating a first current which is proportional to the load voltage of said line;
    transformerless second means, including inverting amplifying means, coupled in parallel relationship to said first means, for generating a second current which is opposite in polarity to said first current and is proportional to one half the instantaneous value of said first current; and
    switching means, coupled in series relationship to said first means and to said ground terminal, and controlled by said modulator, for periodically conducting said first current to said ground terminal;
    a pair of anti-parallel connected diodes, coupled to said transformerless first means and said switching means, through which said first current is conducted;
    said diodes and said transformerless second means being coupled at a common junction and having a low input resistance and voltage below approximately 0.5 volts for adding said first current to said second current in one of two switching conditions of said switching means, the average value of the sum of said first and second currents being proportional to the product of the load current and the load voltage of said line.

8. The apparatus recited in claim 7, wherein said power line comprises a multi-phase current system including a plurality of electrical power lines; wherein separate apparatus comprising said ground terminal, modulator, transformerless first and second means, switching means and said diodes are separately coupled to each of said power lines of said multi-phase current system; and wherein said apparatus for each of said power lines are electrically coupled at a common junction for adding the sums of said first and second currents for each of said power lines of said multi-phase current system.

9. The apparatus recited in claim 7, further comprising quantizer means, coupled to said diodes and said second means, for converting the sum of said first and second currents into an alternating signal, the frequency of which is proportional to the magnitude of the sum of said first and second currents; and a pulse counter, coupled to said quantizer means, for counting the pulses of said alternating signal.

10. The apparatus recited in claim 8, further comprising quantizer means, coupled to said common junction, for converting the added sums of said first and second currents of each of said power lines at said junction into an alternating signal, the frequency of which is proportional to the magnitude of the added sums of said currents; and a pulse counter, coupled to said quantizer means, for counting the pulses of said alternating signal.

11. The apparatus recited in claim 7, wherein said modulator and said switching means comprise a single monolithic integrated semiconductor circuit.

12. The apparatus recited in claim 8, wherein said modulator and said switching means for each of said apparatus for each of said lines of said multi-phase current system comprise a single monolithic integrated semiconductor circuit.

* * * * *